(12) United States Patent
Chow et al.

(10) Patent No.: US 11,574,876 B2
(45) Date of Patent: Feb. 7, 2023

(54) MICROCHIP CHARGE PATTERNING

(71) Applicant: PALO ALTO RESEARCH CENTER INCORPORATED, Palo Alto, CA (US)

(72) Inventors: Eugene M. Chow, Fremont, CA (US); JenPing Lu, Fremont, CA (US); Armin R. Volkel, Mountain View, CA (US); Bing R. Hsieh, Pleasanton, CA (US); Gregory L. Whiting, Mountain View, CA (US); Sean E. Doris, San Francisco, CA (US)

(73) Assignee: PALO ALTO RESEARCH CENTER INCORPORATED, Palo Alto, CA (US)

( * ) Notice: Subject to any disclaimer, the term of this patent is extended or adjusted under 35 U.S.C. 154(b) by 27 days.

(21) Appl. No.: 16/008,961

(22) Filed: Jun. 14, 2018

(65) Prior Publication Data
US 2018/0294232 A1  Oct. 11, 2018

Related U.S. Application Data

(62) Division of application No. 13/652,194, filed on Oct. 15, 2012, now Pat. No. 10,014,261.

(51) Int. Cl.
*H01L 21/00* (2006.01)
*H01L 23/544* (2006.01)
*H01L 23/00* (2006.01)

(52) U.S. Cl.
CPC ............ *H01L 23/544* (2013.01); *H01L 24/95* (2013.01); *H01L 2223/5442* (2013.01);
(Continued)

(58) Field of Classification Search
None
See application file for complete search history.

(56) References Cited

U.S. PATENT DOCUMENTS 6,623,579 B1 * 9/2003 Smith .................... B82Y 30/00
156/73.6
7,332,361 B2  2/2008 Lu et al.
(Continued)

FOREIGN PATENT DOCUMENTS

JP  2007538226 A  12/2007
WO  199512808 A1  5/1995
(Continued)

OTHER PUBLICATIONS

Detig, Robert H., "Electrophorectic Self Assembly: A Manufacturing Process for Various Industries," Final Program and Proceedings of IS&T's NIP20: International Conference on Digital Printing Technologies, Oct. 31-Nov. 5, 2004, Salt Lake City, UT, Society for Imaging Science and Technology, Oct. 31, 2004, pp. 236-240.
(Continued)

*Primary Examiner* — Bradley Smith
(74) *Attorney, Agent, or Firm* — Miller Nash LLP

(57) ABSTRACT

A method of forming a charge pattern on a microchip includes depositing a material on the surface of the microchip, and immersing the microchip in a fluid to develop charge in or on the material through interaction with the surrounding fluid.

5 Claims, 7 Drawing Sheets

(52) U.S. Cl.
CPC ............... *H01L 2223/54426* (2013.01); *H01L 2223/54433* (2013.01); *H01L 2224/95085* (2013.01); *H01L 2224/95145* (2013.01); *H01L 2924/10253* (2013.01); *H01L 2924/10329* (2013.01)

(56) References Cited

U.S. PATENT DOCUMENTS

| | | |
|---|---|---|
| 7,861,405 B2 | 1/2011 | Chow et al. |
| 2005/0098114 A1 | 5/2005 | Christensen |
| 2006/0128057 A1 | 6/2006 | Lu et al. |
| 2009/0176173 A1 | 7/2009 | Glodde et al. |
| 2010/0186221 A1 | 7/2010 | Chow et al. |
| 2010/0186222 A1 | 7/2010 | Chow et al. |
| 2010/0192365 A1 | 8/2010 | Chow et al. |
| 2011/0089549 A1 | 4/2011 | Zenbutsu et al. |
| 2012/0040282 A1 | 2/2012 | Heuft et al. |
| 2014/0087309 A1 | 3/2014 | Cardineau et al. |

FOREIGN PATENT DOCUMENTS

| | | |
|---|---|---|
| WO | 200134765 A1 | 5/2001 |
| WO | 02071465 A1 | 9/2002 |
| WO | 2005001121 A1 | 1/2005 |
| WO | 2010034824 A2 | 4/2010 |

OTHER PUBLICATIONS

European Search Report, EP 13 18 8461, dated Feb. 28, 2014, 9 pages.
Marcus et al., "Ion Pairing," Chem. Rev. 2006, 106, 4585-4621.
Hussain et al., "Charge Generation in Low-Polarity Solvents: Poly(ionic liquid)-Functionalized Particles," Langmuir (2013), 29, 4204-4213.

* cited by examiner

MICROCHIP CHARGE PATTERNING

PRIORITY

This application is a divisional application of U.S. patent application Ser. No. 13/652,194, titled MICROCHIP CHARGE PATTERNING, filed Oct. 15, 2012, which is incorporated by reference herein in its entirety.

BACKGROUND

Systems exist that assemble microchips automatically based upon some sort of encoding such as electrostatic or magnetic coding. The system uses the encoding to identify and position the microchips as part of the assembly process.

Examples of these systems can be found in U.S. Pat. No. 7,861,405, and its related cases, US Patent Publications 20100192365, 20100186221, and 20100186222, owned by the assignee of this application. Another example is shown in U.S. Pat. No. 7,332,361, that teaches charge-encoded elements having basic or acidic surfaces capable of carrying charge in non-polar liquids with charge control agents. Examples include two-particle electrophoretic ink, liquid toner, inorganic oxides and polymers. Standard photolithography or ink-jet technology can be used to pattern these materials to form charge-encoded elements. All of these references are incorporated by reference here. The system uses a charge or magnetic polarity on the chip to sort and position the microchips.

These references make general mention of possible methods of how chips have the charge or polarity, but give no details. For example, issues can arise with the deposition of the charge or polarity. Currently, no current technique exists to deposit a charge pattern on isolated microchips. One approach has charged one end of a nanowire, another has charged up one side of a symmetric microchip, but no work appears to be done on isolated microchips or charge patterning.

The fabrication process should be compatible with existing devices on the chips. In addition, the process should not increase the manufacturing costs, but still allow the patterning on a scalable level between larger areas and small features. In order to provide a flexible system, the system should allow for varying magnitudes of charge density, and ideally but not necessarily, both positive and negative polarity, for multiple levels of chip control and identification. The charge patterns should have good stability to allow long shelf life of the patterned devices.

Another issue with patterning may arise with the chips being attracted to each other. They may gather together or conglomerate based upon their respective charges. The density of the chips needs to remain low enough the chips do not exchange charge by contact with each other.

BRIEF DESCRIPTION OF THE DRAWINGS

FIG. 12-16 show an alternative embodiment of a method of forming a bipolar charge template.

DETAILED DESCRIPTION OF THE EMBODIMENTS

Figure 1:
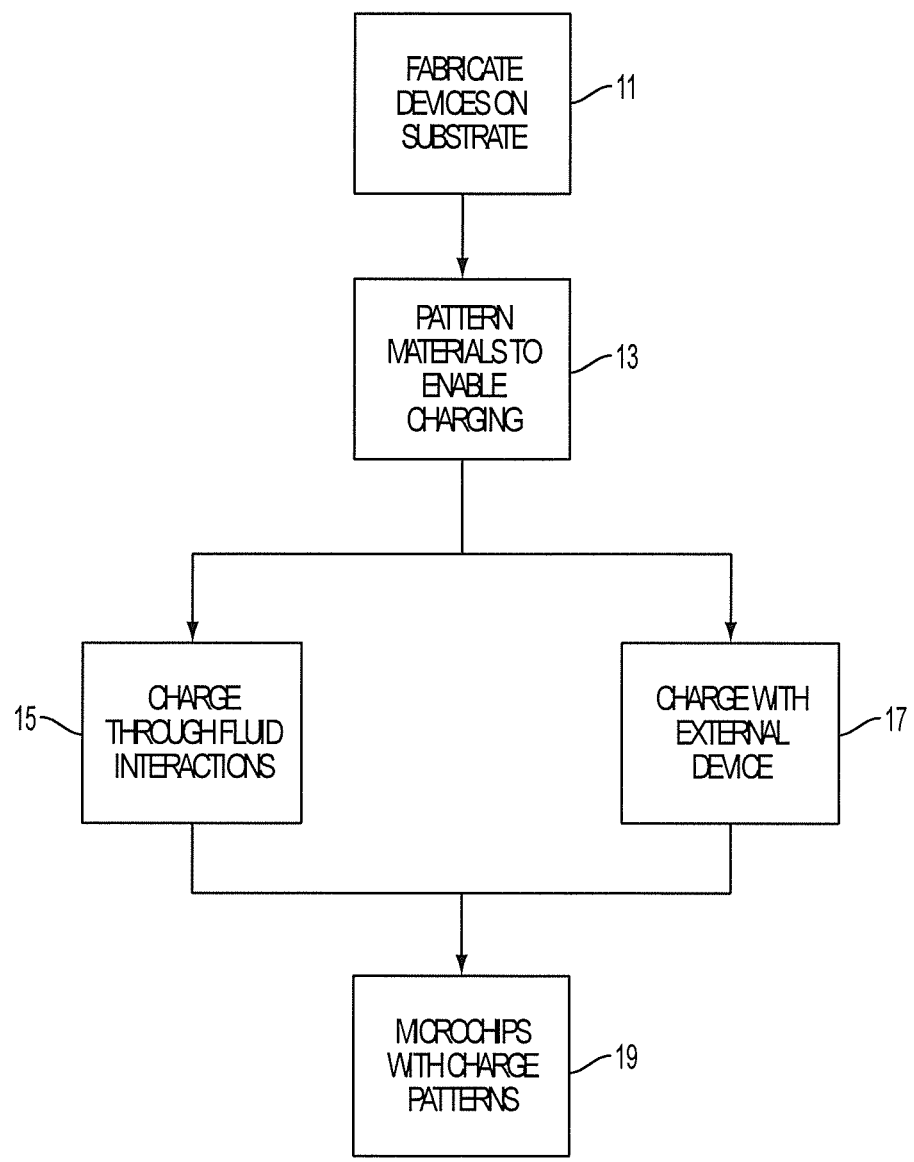
FIG. 1 show an embodiment of an overall method of forming charge patterns on microchips.

FIG. 1 shows an overall embodiment of a method of forming charge patterns on a microchip. At 11, the microchips are fabricated on a substrate, such as silicon, gallium arsenide, complementary metal oxide semiconductor (CMOS) etc. The process then deposits materials on the microchips to enable charging at 13. In one approach, shown in more detail in FIGS. 2-7, the microchips are then submersed in a fluid that causes charge to develop on the materials deposited. In another approach, shown in more detail in FIGS. 8-16, the materials on the microchips are charged using an external device. The end result is microchips with charge patterns on their surfaces in 19.

Figure 2:
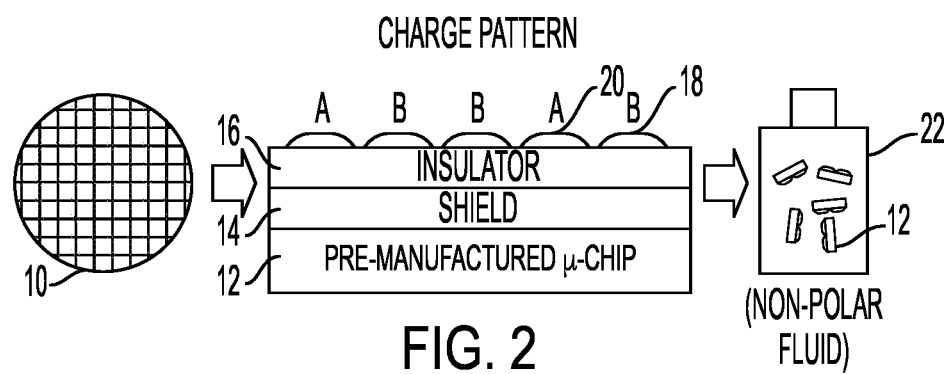
FIG. 2 shows an embodiment of a method of forming charge patterns on a microchip.

FIG. 2 shows an embodiment of a method of forming charge patterns on a microchip. The process will more than likely begin at the wafer level at 10, after manufacture of the individual microchips on the wafer. This allows the process of charge patterning to occur in a more mass-produced manner, using techniques compatible with chip fabrication processes. However, no limitation is intended by this discussion and none should be implied. The individual chips can be patterned using the same techniques after singulation from the wafer.

Using manufacturing techniques compatible with chip processing, the manufactured microchip 12 has a shield 14 to protect the circuitry on the chip. The shield has an insulator 16. The insulator allows charge or material patterns deposited on the surface to avoid interaction with the circuitry on the microchip. The pattern ABBAB may represent different charges, such as +−−+−, or a pattern of materials into which charge will be developed. Through the techniques discussed in more detail further, the charge pattern may consist of alternating regions of differing charge magnitude and/or polarity. The embodiment in this portion of the discussion has the patterns being charge.

Once singulated, the microchips can be placed into a fluid to create an 'ink' bottle 22 or other dispenser. The fluid may contain other additives such as a charge control agent. The charge control agent may either allow the charge to remain stable on the surface of the chips 12, or may cause the charge to develop on the surface of the wafer. The charge generation may take the form of depositing a material, and developing a charge in the material thorough the interaction of the charge patterning material with the fluid component of the ink.

One approach uses deposition of a thin-film of the charge patterning material using solution processing techniques such as spin-coating, printing, dip-coating or self-assembly, or vapor deposition techniques such as plasma enhanced chemical vapor deposition (PECVD) or atomic layer deposition (ALD), followed by immersion in solution after deposition of the film. Examples of materials that could be deposited by solution or vapor techniques include polymers such as polyethylene, polystyrene, polymethylmethacrylate, and parylene and polyvinylalcohol, as well as cationic and anionic polyelectrolytes such as polystyrenesulfonic acid, polyallylamine, polyacrylic acid, and poly(diallyldimethylammonium chloride). Other examples include organometallic salts such as zinc stearate or aluminum stearate as well as oxides, such as silica, alumina or titania. In addition materials which form self-assembled monolayers such as octadecyltrichlorosilane, phenethyltrichlorosilane, hexamethyldisilazane, allyltrimethoxysilane or perfluorooctyltrichlorosilane may also be used.

The charge patterning material may not be a pure material but rather a blend of one or more materials, possibly to enhance charge generating properties, improve processing performance, or impart new functionality to the film such as making it light sensitive. For materials deposited from solution, they would likely be first dissolved in a solvent such as toluene, hexane, water, isopropanol, or tetrahydrofuran to enable solution processing. An example process may involve spin coating the material onto the surface of the microchip, patterning the material either using light directly if a light-sensitive formulation of the charge-patterning material is used, or in a separate step through photolithographic/etching cycles, and immersing the chip into solution where free charges are formed through interaction between the fluid and the material.

Figure 4:
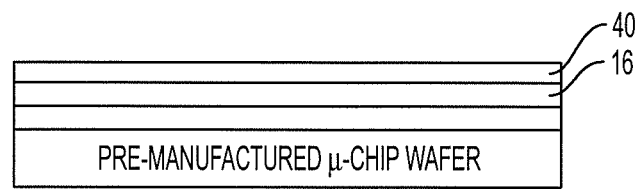
FIGS. 4-7 show an embodiment of a method of photolithographically forming charge patterns on a microchip.
Figure 5:
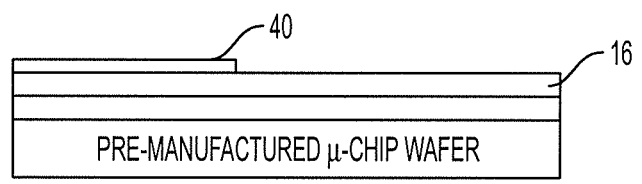
Figure 6:
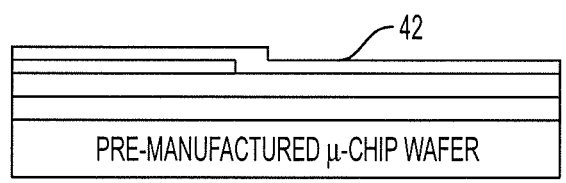
Figure 7:
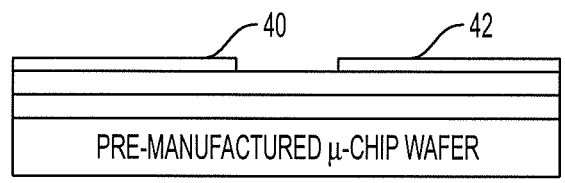

In FIG. 4, a first polymer is spun onto the insulator 16 and photolithographically defined in FIG. 5, exposing a portion of the insulator 16. A second polymer 42 is then spun on or otherwise deposited on the first polymer and the exposed insulator in FIG. 6. The second polymer is then patterned to define a region separate from the first region, typically with a region of the insulator as shown in FIG. 7. The two different polymers then retain different charges, or magnitudes of charge to form a charge pattern. In addition to the use of two solution processed polymers, other embodiments may use a combination of a solution processed material to generate one polarity/magnitude of charge and a vapor deposited material to generate another polarity/magnitude of charge, other embodiments could use two different vapor deposited materials.

If immersed in a polar liquid, such as water, most surfaces become charged, as some of the surface molecules dissociate. Charge tends to be more negative or positive depending on the chemical composition of the surface. Typical functional groups that develop a negative surface change include sulfonic acids, phosphonic acids, and carboxylic acids amongst others. Typical functional groups that develop positive surface charges include amines and imidazoles, amongst others. The range of Coulomb interaction of the charged microchips is controlled by the ionic strength of the solution, but is typically rather short, in the range of 1 to 10 micrometers due to the high ion content.

In this embodiment the use of non-polar fluids is desired however, since such Coulomb interactions between charged entities are felt over much larger length scales, in the range of 10-100 micrometers. Examples of non-polar fluids include isoparaffinic liquids and other hydrocarbon liquids such as dodecane. In non-polar liquids charge control agents, typically amphiphilic surfactant materials (both ionic and non-ionic), such as phosphatidylcholine (lecithin), sorbitan monooeleate (span-80), aluminium-di-tert-butyl salicylate (ALOHOS), polyisobutylene succinimide (OLOA), or sodium dioctylsulfosuccinate (AOT) amongst others may need to be added to the liquid to assist in developing charge.

If the surrounding liquid is air, charging of the surface can be done through tribo-actions. For example, in Xerography, the toner particles are charged by contacting specifically designed developer particles. The charge patterning material has to be selected such that it charges in specific ways when contacted with the developer material. The density of the chips should stay low enough to control charge exchange between microchips accidentally hitting each other.

Figure 3:
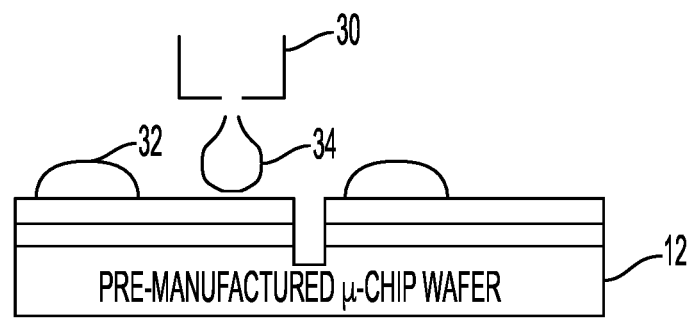
FIG. 3 shows an embodiment of a method of printing charge patterns on a microchip.

In another approach, shown in FIG. 3, an ink-jet head 30 can deposit the charge-patterning material. Candidate material may include waxes, polymers, such as polyelectrolytes, or blends of materials amongst others. After deposition of the charge patterning material, as in previous descriptions the chips would be singulated and immersed in a fluid where free charges would be generated.

In another approach, a self-assembled monolayer can be used along with another material, such as an oxide, to create charged regions on the chip. This could be accomplished, for example, by first depositing the oxide, then depositing the self-assembled monolayer having the desired functionality over the oxide. Using photolithography and etching this self-assembled monolayer could then be patterned revealing the oxide underneath. In another approach, the oxide could be deposited followed by patterning of a sacrificial blocking material (such as photoresist), deposition of the self-assembled monolayer could then take place, followed by removal of the sacrificial material, again revealing the underlying oxide surface, creating an oxide, self-assembled monolayer pattern. This second approach has the benefit in that the self-assembled monolayer deposition and blocking material removal steps can be carried out either at the wafer scale, or at the chiplet scale after wafer singulation.

FIGS. 4-7 show processes of an embodiment in which photolithographic patterned polymers, inorganic materials or a mixture of the two are used. These materials can either be tribo-charged or chemically charged using a charge control agent, in a dielectric fluid to carry different polarities of charge. Photolithographic defined charging of a dielectric with a corona device is another approach, using dry film resist. Commercially available dry film resists express substantial conductivity difference between exposed ultraviolet and unexposed regions. FIGS. 4-7 show a process for photolithographic materials.

In a photoconductor coating embodiment, one may use inorganic photoconductor materials such as amorphous silicon and selenium, or single layer or multilayer organic photoconductors. If such a photoconductor coating is used, it receives charge from a corotron or scorotron to give the desired charge signs and patterns. As the terms are used here, a corotron is a corona charging device typically used in electrophotography/Xerography that has a wire connected to a high voltage power source. In a typical application, the wire generates an electric field that charges up a photoreceptor in preparation for receiving charged toner particles. A scorotron is a screen corotron.

Figure 8:
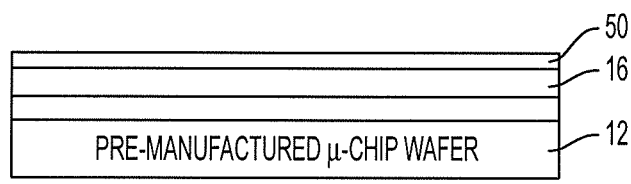
FIGS. 8-10 show an embodiment of a method of forming a charge pattern using a scorotron.
Figure 9:
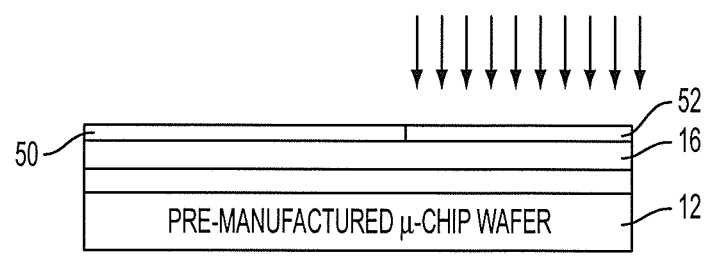
Figure 10:
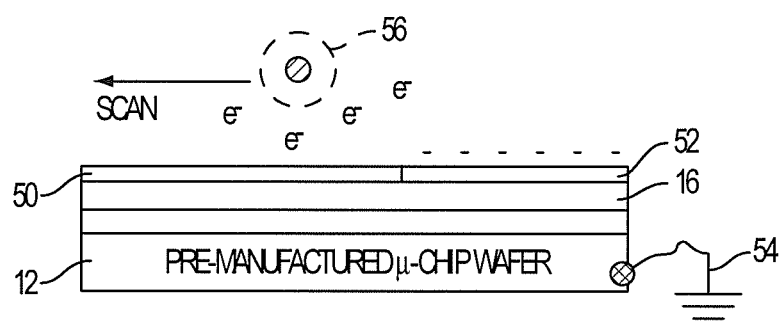

Another embodiment uses photolithographic define charging of a dielectric with a corona device. Commercially available dry film resist expresses substantially conductivity difference between ultraviolet exposed and unexposed regions. FIGS. 8-10 show one embodiment of such a process. In FIG. 8, a dry film resist is laminated onto the insulator layer 16 over the microchip or microchip wafer 12. In FIG. 9, ultraviolet light exposes a portion 52 of the dry resist, creating high and low conductivity regions. In FIG. 10, the wafer or microchip 12 is grounded by connection 54 and charged with a scorotron or corotron 56, to form charge patterns based upon the previously exposed regions 50 and 52 of the dry film resist. This forms a single charge template, where the surface has one polarity of charge. One may verify the charge patterns by spreading beads of known charge and imaging with a camera, or measuring the field directly in air with a non-contact electrostatic volt meter.

Figure 11:
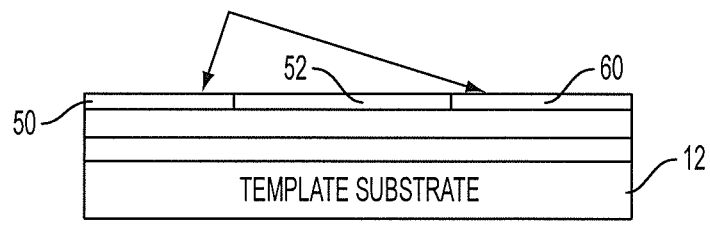
FIGS. 11-13 show an embodiment of a method of forming a bipolar charge template.
Figure 12:
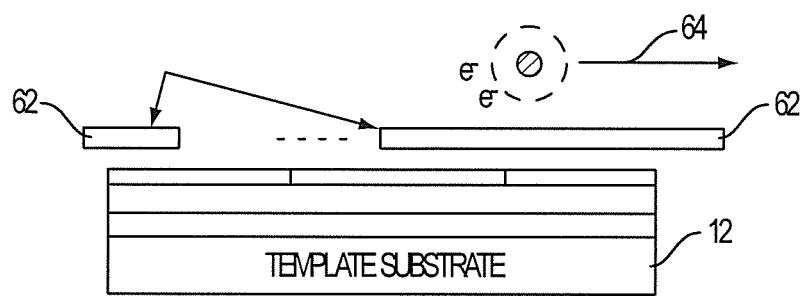
Figure 13:
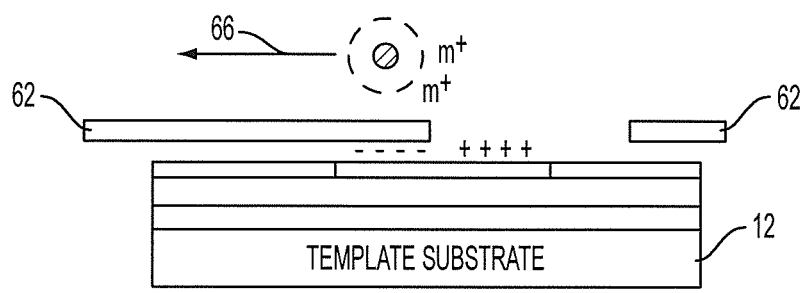

FIGS. 11-13 show an embodiment of a method of forming a dual charge template. Ultraviolet light exposes a portion of the dry film resist 50 to form a low conductivity region 52.

Using a stencil mask 62 on top of the dry film resist allows exposure of only a portion of the low conductivity region formed by the UV exposure. The scorotron 64 applies charge of a first polarity to a portion of the low conductivity region not protected by the mask 62. The process shifts the mask 62 to cover the charged portion of the low conductivity region. The scorotron then charges the uncharged portion of the low conductivity region with a lower dose of the opposite sign ions to create the other sign charge pattern. In order to differentiate between the two scorotron processes, the opposite sign charge pass of the scorotron is referred to as 66.

Figure 14:
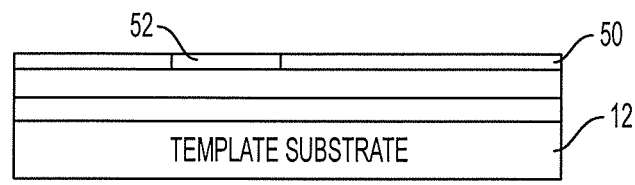
Figure 15:
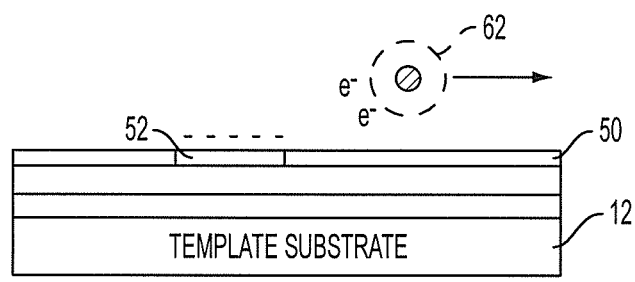
Figure 16:
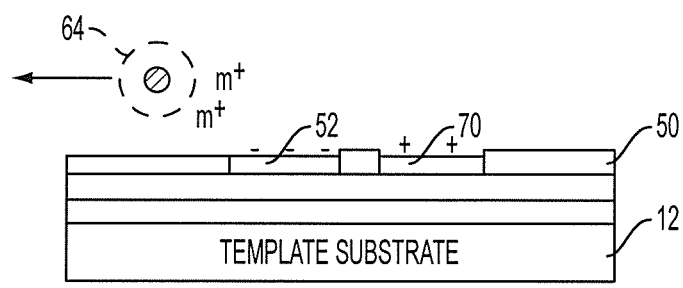

In an alternative embodiment, a bipolar or a dual charge template can result from a dual exposure, shown in FIGS. 14-16. FIG. 14 shows a first exposure forming a first low conductivity region 52 on the dry film resist 50. This first region then receives a first polarity charge from a scorotron 62. The dry film resist then receives a second exposure of UV light to form a second low conductivity region 70. This second region then receives a charge of the opposite polarity from the scorotron 64.

In this manner, charge patterns can be generated on the surface of microchips, either before or after singulation from a wafer. The techniques used are compatible with semiconductor fabrication processes, either using scorotron or corotron charging, tribo-charging, or by application of charged materials. Free charges may then be generated directly or through the interaction of these materials with the surrounding fluid in the chip "ink." The charge patterns contain information usable in automated systems to sort, organize and arrange microchips into larger circuits.

It will be appreciated that several of the above-disclosed and other features and functions, or alternatives thereof, may be desirably combined into many other different systems or applications. Also that various presently unforeseen or unanticipated alternatives, modifications, variations, or improvements therein may be subsequently made by those skilled in the art which are also intended to be encompassed by the following claims.

What is claimed is:

1. A method of forming a charge pattern on a microchip, comprising:

depositing a first film of a first polymer on an insulator surface of the microchip and photolithographically defining the first film to expose a portion of the insulator surface;

depositing a second film of a second polymer at least partially on the first film;

photolithographically patterning the second polymer to define a region separate from the portion of the first region, wherein the first polymer and the second polymer retain one of either different charges or different magnitudes of a same charge to form the charge pattern; and immersing the microchip in a non-polar fluid comprising one selected from the group consisting of: an isoparafinnic liquid, a hydrocarbon liquid and dodecane.

2. The method as claimed in claim 1, wherein depositing the first polymer comprises depositing one of an anionic polyelectrolyte, cationic polyelectrolyte, a non-ionic polymer, polystyrenesulfonic acid, poly(diallyldimethylammonium chloride), polyethylene, or polyvinylalcohol.

3. The method as claimed in claim 1, wherein the non-polar fluid includes charge control agents comprise one of ionic amphiphilic surfactant materials, non-ionic amphiphilic surfactant materials, lecithin, span-80, ALOHOS, OLOA, or AOT.

4. The method of claim 1, wherein depositing the material comprises one of spin-coating, printing, dip-coating, self-assembly, or vapor deposition.

5. The method as claimed in claim 1, further comprising singulating the wafer into microchips.

* * * * *